(12) United States Patent
Lavier et al.

(10) Patent No.: US 7,692,910 B2
(45) Date of Patent: Apr. 6, 2010

(54) FAILURE DETECTION IN A VOLTAGE REGULATOR

(75) Inventors: Jack Lavier, Ft. Collins, CO (US); Samuel M. Babb, Ft. Collins, CO (US); Kelly Jean Pracht, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 560 days.

(21) Appl. No.: 11/729,646

(22) Filed: Mar. 29, 2007

(65) Prior Publication Data

US 2008/0239593 A1 Oct. 2, 2008

(51) Int. Cl.
*H02H 3/08* (2006.01)
*H02H 9/02* (2006.01)
*G05J 1/569* (2006.01)
*G05J 1/573* (2006.01)

(52) U.S. Cl. .................. 361/93.1; 323/234; 323/282; 323/283; 323/284; 323/276

(58) Field of Classification Search ............. 361/93.1; 323/234, 282, 283, 284, 276
See application file for complete search history.

(56) References Cited

U.S. PATENT DOCUMENTS

| | | | |
|---|---|---|---|
| 5,774,321 A | 6/1998 | Kim et al. | |
| 6,031,743 A | 2/2000 | Carpenter et al. | |
| 6,229,292 B1 | 5/2001 | Redl et al. | |
| 6,329,801 B1 | 12/2001 | Zuniga et al. | |
| 6,473,280 B1 * | 10/2002 | Buxton et al. | 361/18 |
| 7,518,888 B2 * | 4/2009 | Chu et al. | 363/21.12 |
| 2005/0001600 A1 | 1/2005 | Morales | |

* cited by examiner

*Primary Examiner*—Stephen W Jackson
*Assistant Examiner*—Zeev Kitov

(57) ABSTRACT

A control logic detects voltage regulator failure in a power supply. The control logic comprises first and second lines configured for respective connection to a controller node and a phase node of a voltage regulator, a delay element coupled to the first line configured to delay signals at the controller node into alignment with signals at the phase node, and a level detector coupled to the second line configured to convert the signals at the phase node into at least two digital representations indicative of respective signal thresholds. A logic compares timing of the delayed signals with the digital representations and detects occurrence of a voltage regulator fault based on the timing comparison.

20 Claims, 8 Drawing Sheets

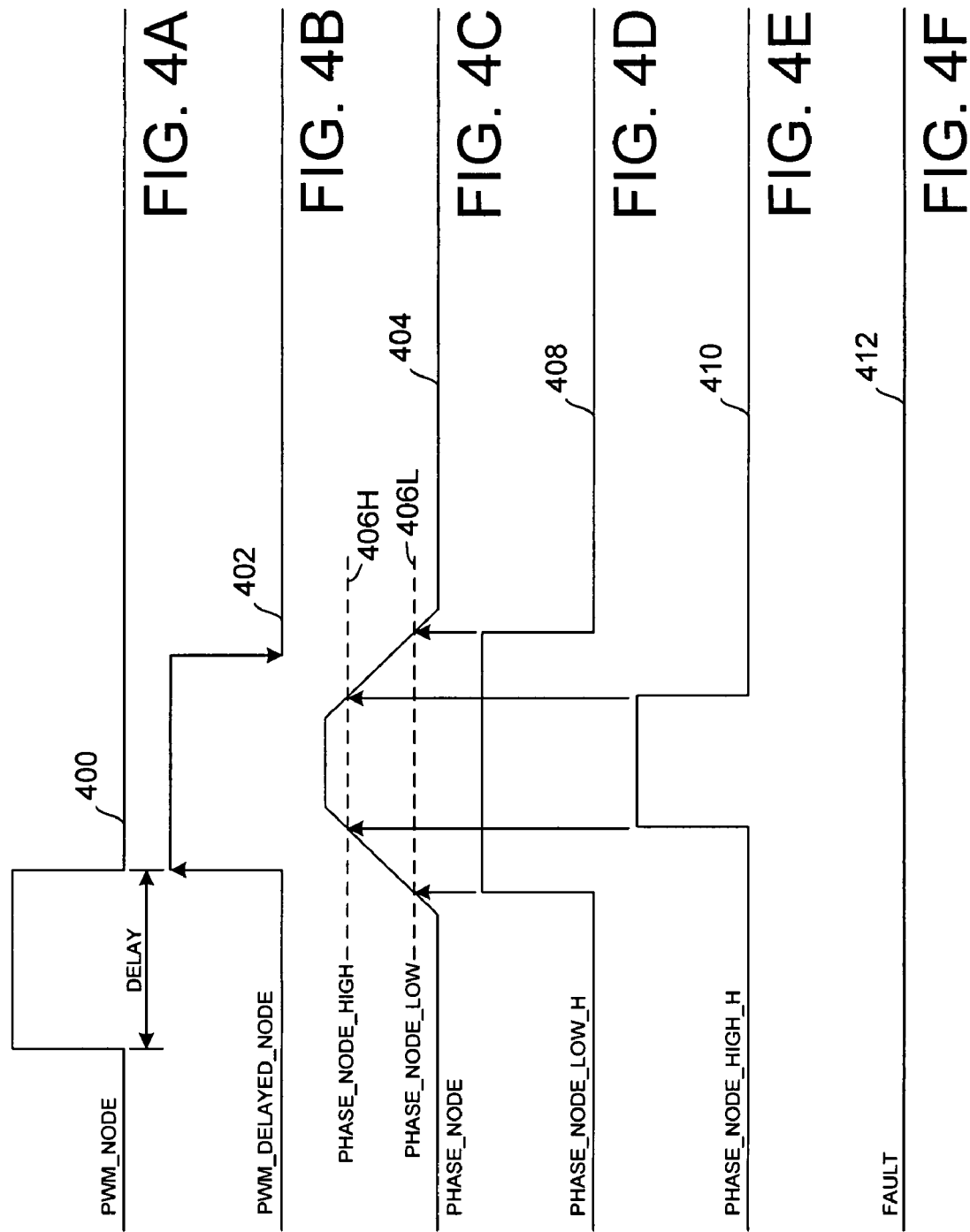

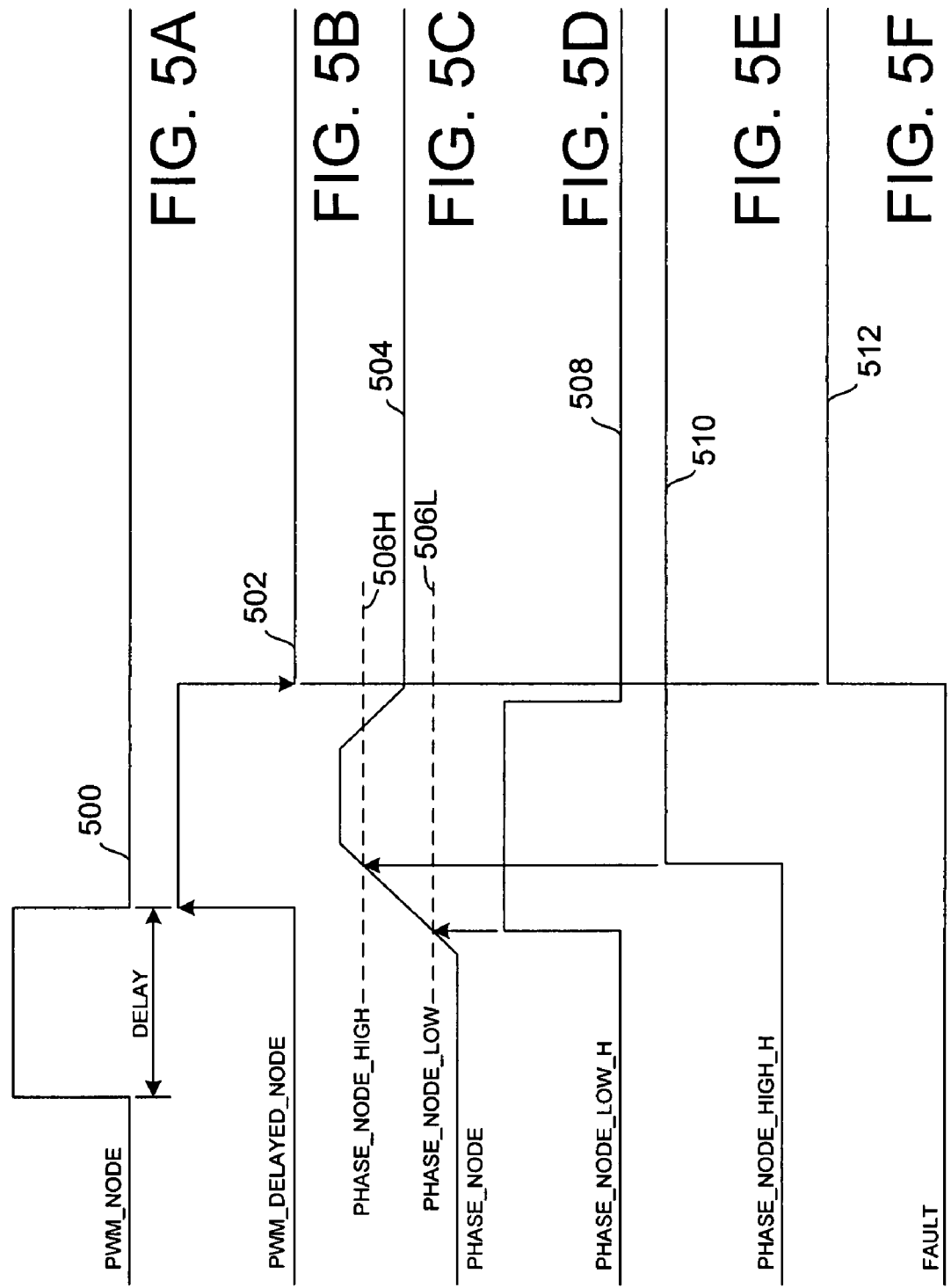

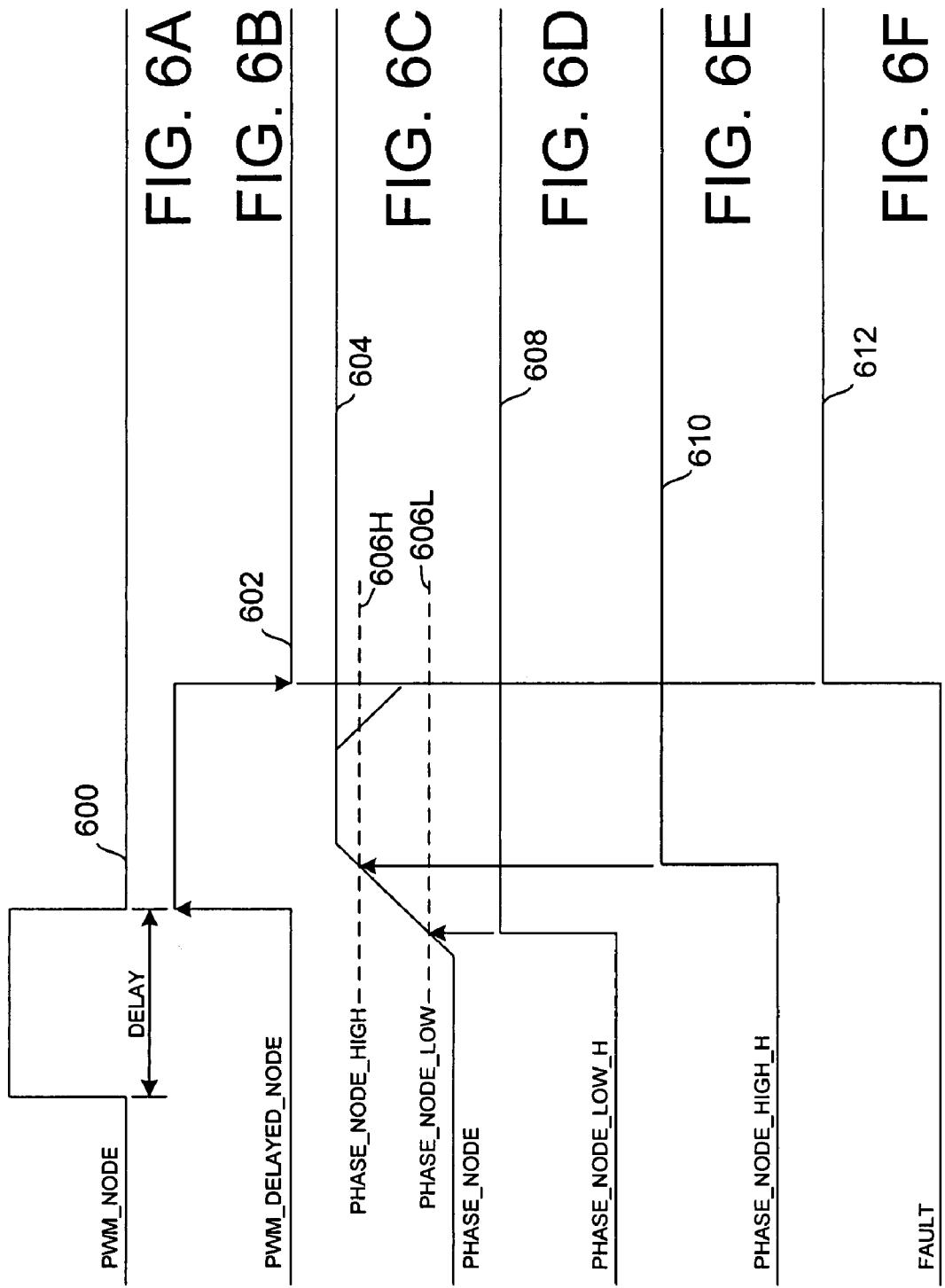

FAILURE DETECTION IN A VOLTAGE REGULATOR

BACKGROUND

Voltage regulators, for example DC-DC converters, supply a stable power source to an electronic system. Voltage regulators are typically designed to maintain terminal voltage sources within specified limits even in variable input voltage and/or load conditions. Voltage regulators are typically susceptible to faults or failures, which can cause the output voltage of the regulator to go outside a suitable range during a fault. A fault in the voltage regulator can damage a device using the regulated DC voltage or render the device unusable.

A fault may not be detected until the affected voltage regulator is out of tolerance as determined by a fault detection device that monitors the output voltage of the regulator. To avoid catastrophic failure of the system, redundant voltage regulators can be used to ensure reliability, coupled in parallel to a load device so that if one voltage regulator fails, another continues to maintain a stable supply voltage.

Typically the redundant voltage regulators are connected at an output voltage rail. To isolate the parallel-connected voltage regulators for fault tolerance, a diode can be connected between the individual voltage regulators and the rail. However, an OR-connection of the diodes to isolate a faulty voltage converter can decrease system efficiency due to the finite voltage drop of the diodes and can prevent suitable dynamic load performance.

The difficulties in making the parallel connection of redundant voltage regulators can be avoided by detecting faults and disabling a faulty regulator before the output voltage goes out of regulation.

SUMMARY

An embodiment of control logic detects voltage regulator failure in a power supply. The control logic comprises first and second lines configured for respective connection to a controller node and a phase node of a voltage regulator, a delay element coupled to the first line configured to delay signals at the controller node into alignment with signals at the phase node, and a level detector coupled to the second line configured to convert the signals at the phase node into at least two digital representations indicative of respective signal thresholds. A logic compares timing of the delayed signals with the digital representations and detects occurrence of a voltage regulator fault based on the timing comparison.

BRIEF DESCRIPTION OF THE DRAWINGS

Embodiments of the invention relating to both structure and method of operation may best be understood by referring to the following description and accompanying drawings:

FIGS. 4A through 4F are a series of time waveforms illustrating operation of embodiments of the illustrative voltage regulator failure detection circuit, system, and operating method during normal operation;

FIGS. 5A through 5F are a series of time waveforms showing operation of embodiments of the illustrative voltage regulator failure detection circuit, system, and operating method in conditions of a resistive failure in an upper field effect transistor (FET) of driver circuit; and FIGS. 6A through 6F are a series of time waveforms depicting operation of embodiments of the illustrative voltage regulator failure detection circuit, system, and operating method in conditions of a short-circuit failure in an upper field effect transistor (FET) of driver circuit.

DETAILED DESCRIPTION

A voltage regulator failure detection circuit, system, and operating method enable fast detection of failure that is highly useful in redundant voltage regulator arrangements. The detection schemes and configurations enable detection of resistive field effect transistor (FET) short-circuits and open circuit conditions faster than can be achieved by simply monitoring voltage at a phase node and pulse width modulator (PWM) node.

The illustrative voltage regulator failure detection circuit, system, and operating method monitor for expected voltage values at the phase node relative to the PWM node.

A typical technique for detecting a failure in a voltage regulator involves tracking the output voltage of the regulator and classifying the condition as a failure for a predetermined condition, such as a dip of predetermined magnitude, in the output voltage. A difficulty with monitoring the output voltage to detect failure is that detection is too late. For example, in a power supply with multiple redundant voltage regulators detection based on output voltage monitoring can result in intervention that is too late to shut down the failing voltage regulator in time to prevent damage.

Accordingly, a fast detection is sought that enables detection before the output voltage dips.

One fast technique that improves detection speed over techniques involving monitoring of output voltage is performed by monitoring voltage at a pulse width modulator (PWM) node and a phase node, assuming digital values for the PWM and phase node. A difficulty with the technique is that the signal at the phase node typically does not have the square-wave form of a two-level or digital signal, creating some difficulty in detecting some faults. For example, the technique is susceptible to missing detection of a resistive fault. Typically, a resistive fault prevents the output voltage for a voltage regulator from reaching the full supply level.

In contrast, the voltage regulator failure detection circuit, system, and operating method described herein enable fast detection of voltage regulator faults and enable detection of more types of faults that can occur in voltage regulators. The illustrative voltage regulator failure detection circuit, system, and operating method can detect resistive faults and detects such faults immediately after the fault is most likely to occur.

Figure 1A:
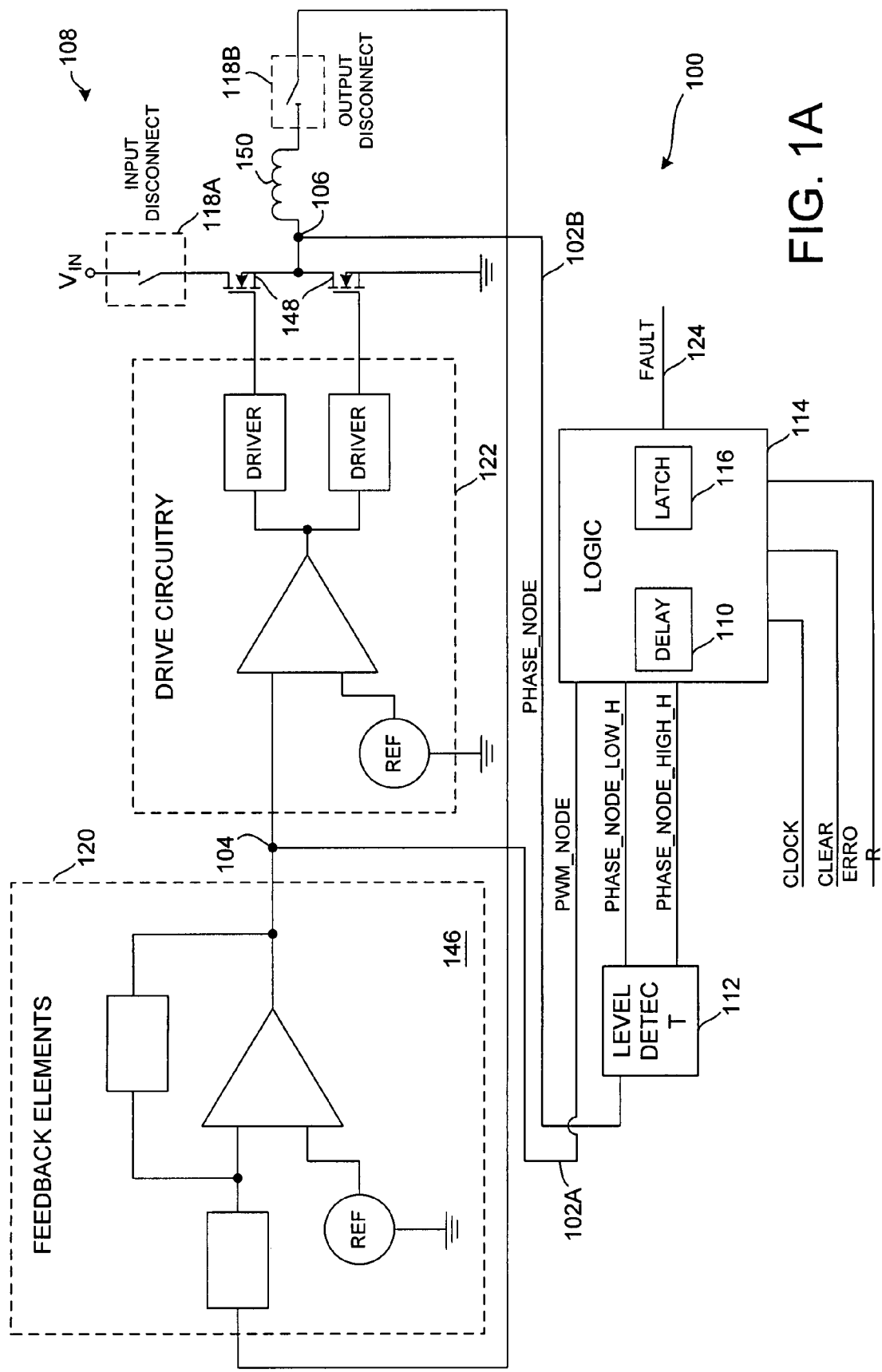
FIG. 1A is a schematic block and circuit diagram showing an embodiment of a control logic that can detect voltage regulator failure in a power supply.

Referring to FIG. 1A, a schematic block and circuit diagram depicts an embodiment of a control logic 100 that can detect voltage regulator failure in a power supply. The control logic 100 comprises first 102A and second 102B lines for respective connection to a controller node 104 and a phase node 106 of a voltage regulator 108. A delay element 110 is coupled to the first line 102A and delays signals at the controller node 104 into alignment with signals at the phase node 106. A level detector 112 coupled to the second line 102B converts the signals at the phase node 106 into at least two digital representations indicative of respective signal thresholds. A logic 114 compares timing of the delayed signals with the digital representations and detects occurrence of a voltage regulator fault based on the timing comparison.

The logic 114 can detect a voltage regulator fault before the fault can be detected at an output voltage terminal of the voltage regulator 108.

In the illustrative control logic 100, the first line 102A connects to an output node 104 of a pulse width modulator 120 and the second line 102B connects to an output node 106 of a driver circuit 122.

The logic 114 compares timing of the delayed signals with the two or more digital representations and can detect voltage regulator faults including short-circuits, resistive failures, and open-circuits based on the timing comparison.

In some embodiments, the control logic 100 can further comprise a latch 116 coupled to the logic 114 that latches an error signal for a detected voltage regulator fault. One or more switches 118A, 118B is coupled to the latch 116 and configured to electrically isolate a voltage regulator 108 subject to the fault.

The control logic 100 can further comprise one or more control lines 124 communicatively coupling the logic 114 to one or more switches 118A, 118B. The logic 114 can detect a particular type of voltage regulator fault and select a switch from switches 118A, 118B that can disconnect a voltage regulator 108 based on the detected fault type. Operation of the switch electrically isolates the voltage regulator 108.

In some implementations, the logic 114 can be configured for monitoring voltage regulator signals for multiple phases and detecting voltage regulator fault per-phase for the multiple phases.

In various embodiments the illustrative pulse width modulator 120 can be replaced with any suitable controller such as a DC-DC converter, pulse width modulator, delta modulator, and the like. The controller 120 includes feedback elements 146 that can be formed of any suitable devices and/or components. The signal produced by the converter or controller 120 is monitored at the control node 104 and passed through the driver circuit 122 and monitored at the phase node 106 coupled between the field effect transistors (FETs) 148 and an inductor 150 for the DC-DC converter.

Figure 1B:
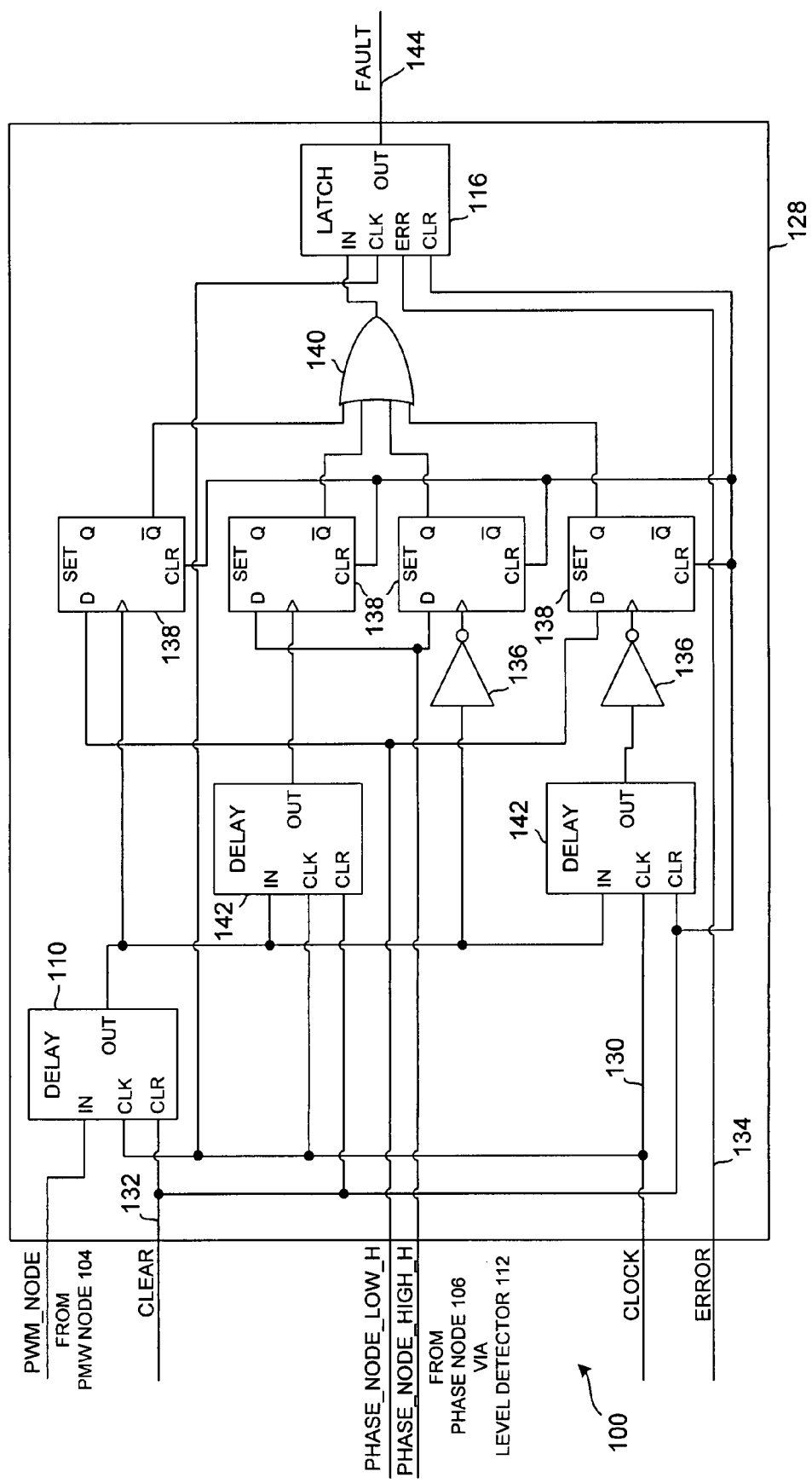
FIG. 1B is a schematic block diagram illustrating an example of a logic block that can be implemented in an embodiment of the control logic.

Referring to FIG. 1B, a schematic block diagram shows an example of a logic block 128 that can be implemented in an embodiment of the control logic 100. Input signals to the logic block 128 include a pulse width modulation node (PWM_NODE) signal that is accessed from the controller node 104 and phase node low (PHASE_NODE_LOW_H) and high (PHASE_NODE_HIGH_H) signals that are accessed from the phase node 106 via the level detector 112. The level detector 112 enables the signal at the phase node 106 to be measured with multiple comparisons or level detections to generate digital representations indicative of voltage at the phase node 106. Input signals to the logic block 128 also include a clock signal (CLK) on clock line 130, a clear signal on clear line 132, and an error signal on an error line 134.

The PWM_NODE signal is delayed by passage through delay element 110 and compared to the two phase node signals, as shown in the illustrative example by a logic circuit including inverters 136, digital (D) flip-flops 138, and AND gate 140. Additional delay elements 142 can be used to align timing of the phase node signals to the PWM_NODE signal. A latch 116 is used to latch a fault error signal on fault line 144 that can be used to isolate the voltage regulator for example by isolation of field effect transistors (FETs).

Figure 2:
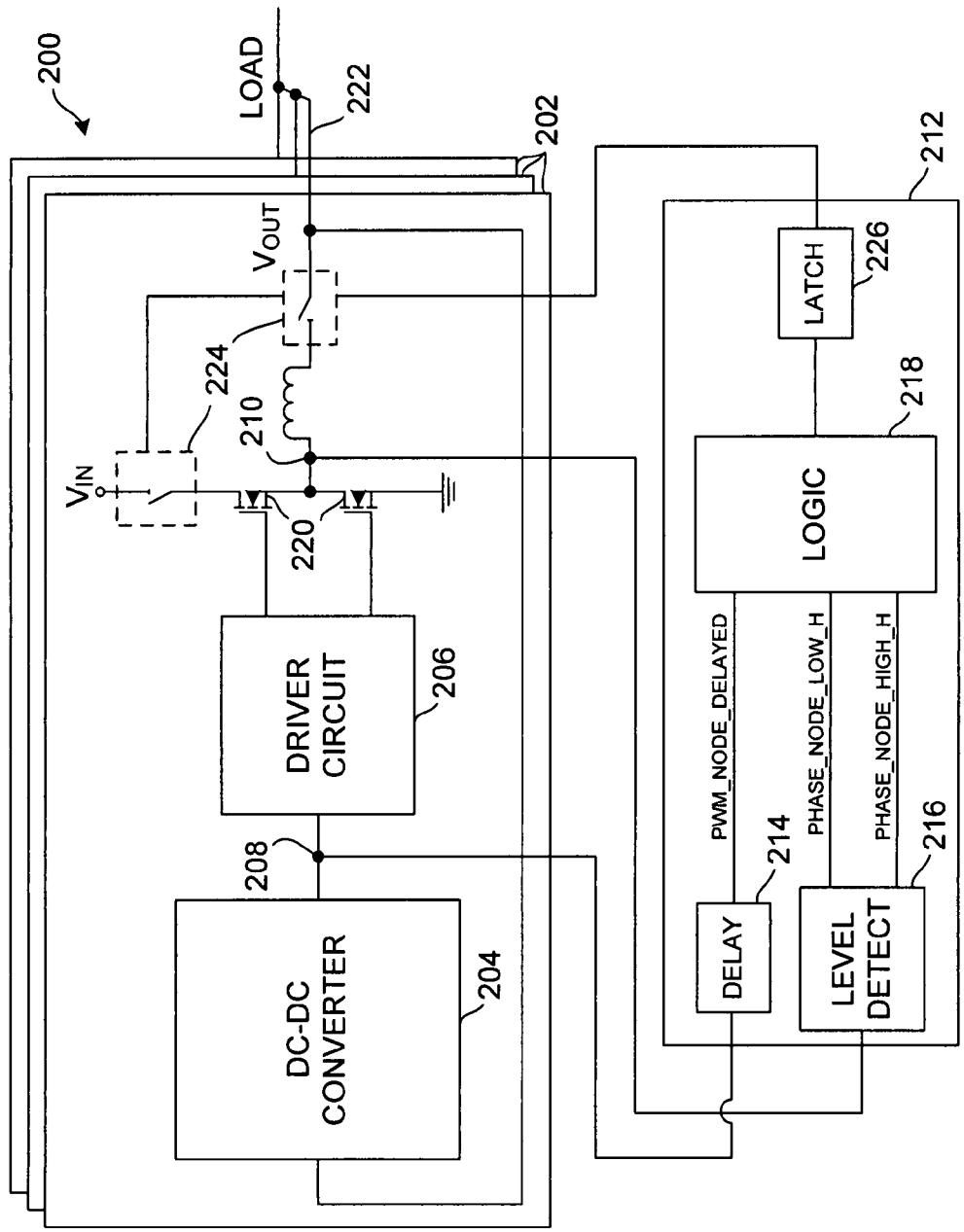
FIG. 2 is a schematic block and circuit diagram depicting an embodiment of a power supply including a control logic that can detect volt age regulator failure in a power supply.

Referring to FIG. 2, a schematic block and circuit diagram illustrates an embodiment of a power supply 200 including a control logic that can detect voltage regulator failure in a power supply. The power supply 200 comprises one or more voltage regulators 202. The individual voltage regulators 202 can comprise a direct current (DC)-DC converter 204, a driver circuit 206 coupled to the DC-DC converter 204 at a controller node 208 that is configured to drive a controller voltage at a phase node 210, and a control logic 212 that is communicatively coupled to the controller node 208 and the phase node 210. The control logic 212 detects voltage regulator failure in the power supply 200 and comprises a delay element 214, a level detector 216, and logic 218. The delay element 214 delays signals at the controller node 208 into alignment with signals at the phase node 210. The level detector 216 converts signals at the phase node 210 into two or more digital representations indicative of associated signal thresholds. The logic 218 compares timing of the delayed signals with the digital representations and detects occurrence of a voltage regulator fault based on the timing comparison. The logic 218 compares the delayed controller node signal to the multiple digital phase node representations to enable detection of a voltage regulator fault before the fault can be detected at the output voltage terminal 222 of the voltage regulator 202.

The illustrative structures and techniques can be used for any type of voltage detector and applies for any type of circuit that includes a controller or converter such as a DC-DC converter, pulse width modulator (PWM), delta modulator (DM), and the like that drive a voltage through a set of FETs. For example, the illustrative structures and techniques can be typically used with DC-DC converter of standard topology.

In an illustrative embodiment, the logic 218 can detect several types of voltage regulator fault or failure, for example short-circuit, resistive failure, and open-circuit fault conditions. For example, faults or failures can be detected for either or both of the field effect transistors (FETs) 220 in the illustrative driver circuit 206.

The control logic 218 can comprise a latch 226 that latches error signals for a detected voltage regulator fault. The voltage regulators 202 can have one or more switches 224 that are communicatively coupled to the latch 226 enabling electrical isolation of the voltage regulator which is corrupted by the fault condition.

For example, the illustrative voltage regulators 202 comprise one or more switches 224. The control logic 218 can be configured to detect the type of voltage regulator fault and selecting a switch 224 that disconnects the voltage regulator 202 appropriately for the detected fault type. The control logic 218 actuates the selected switch 224 to electrically isolate the voltage regulator.

The implementations illustrated in FIGS. 1 and 2 depict a simplified case with a single phase. In other implementations can be multiple phase wherein the analysis is performed per-phase. For example larger voltage regulators can have drive circuitries that form four, six, or more phases while the simplified example shows has only one phase.

Thus, the power supply 200 and control logic 218 can be implemented, as illustrated, with analysis of a single phase. In other embodiments, the control logic 218 can monitor voltage regulator signals for multiple phases and detect voltage regulator faults per-phase for the phases. Extension to additional phases can be made simply by duplicating the illustrative structures and associated techniques.

In typical operation, the multiple redundant voltage regulators 202 include one regulator that supplies power and one or more standby regulators that remain idle but ready for operation. When a fault is detected, the formerly active regulator that is subject to the fault is isolated and a standby regulator made active.

Figure 3A:
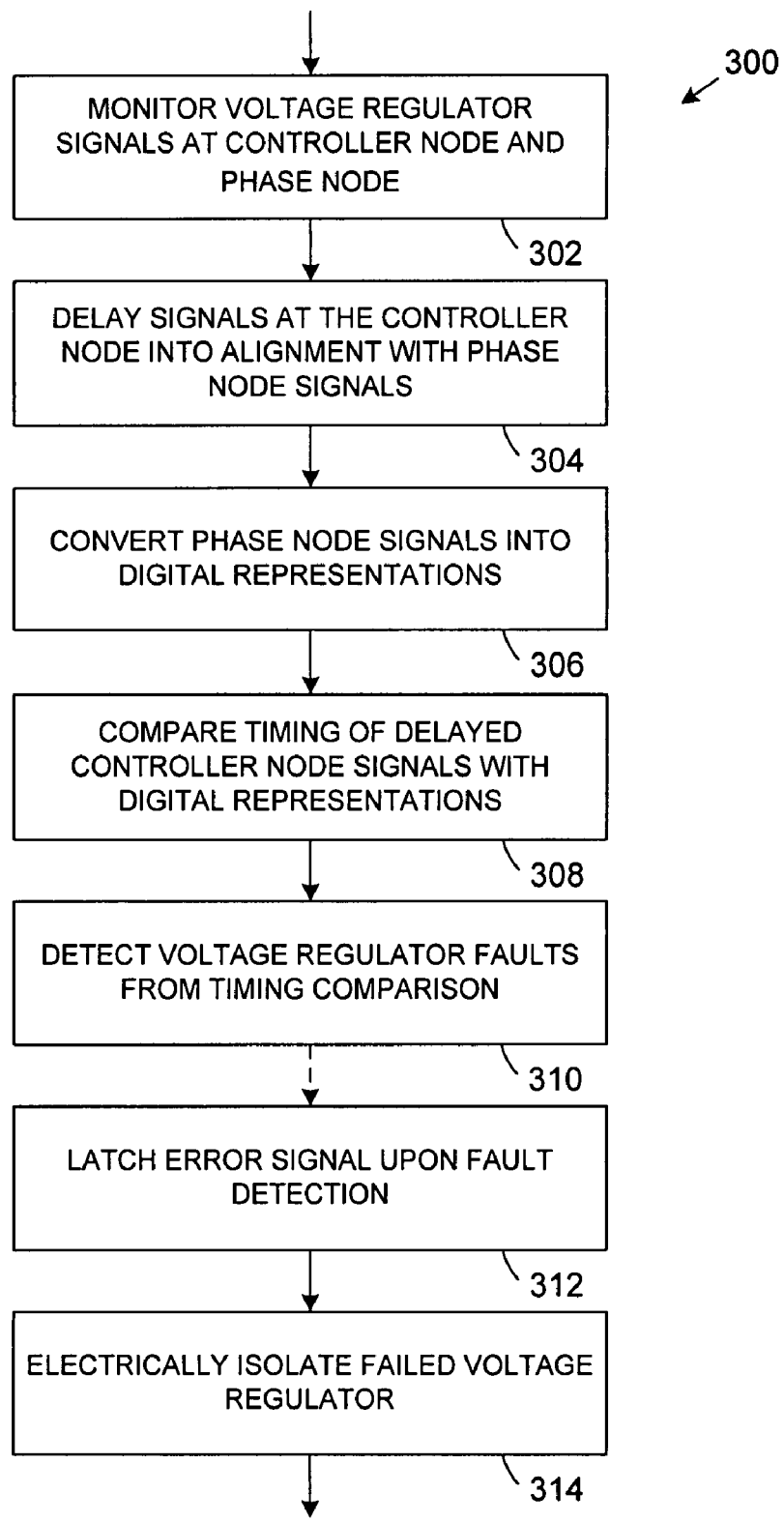
FIGS. 3A and 3B are flow charts illustrating one or more embodiments or aspects of a method for detecting failure or fault in a voltage regulator.
Figure 3B:
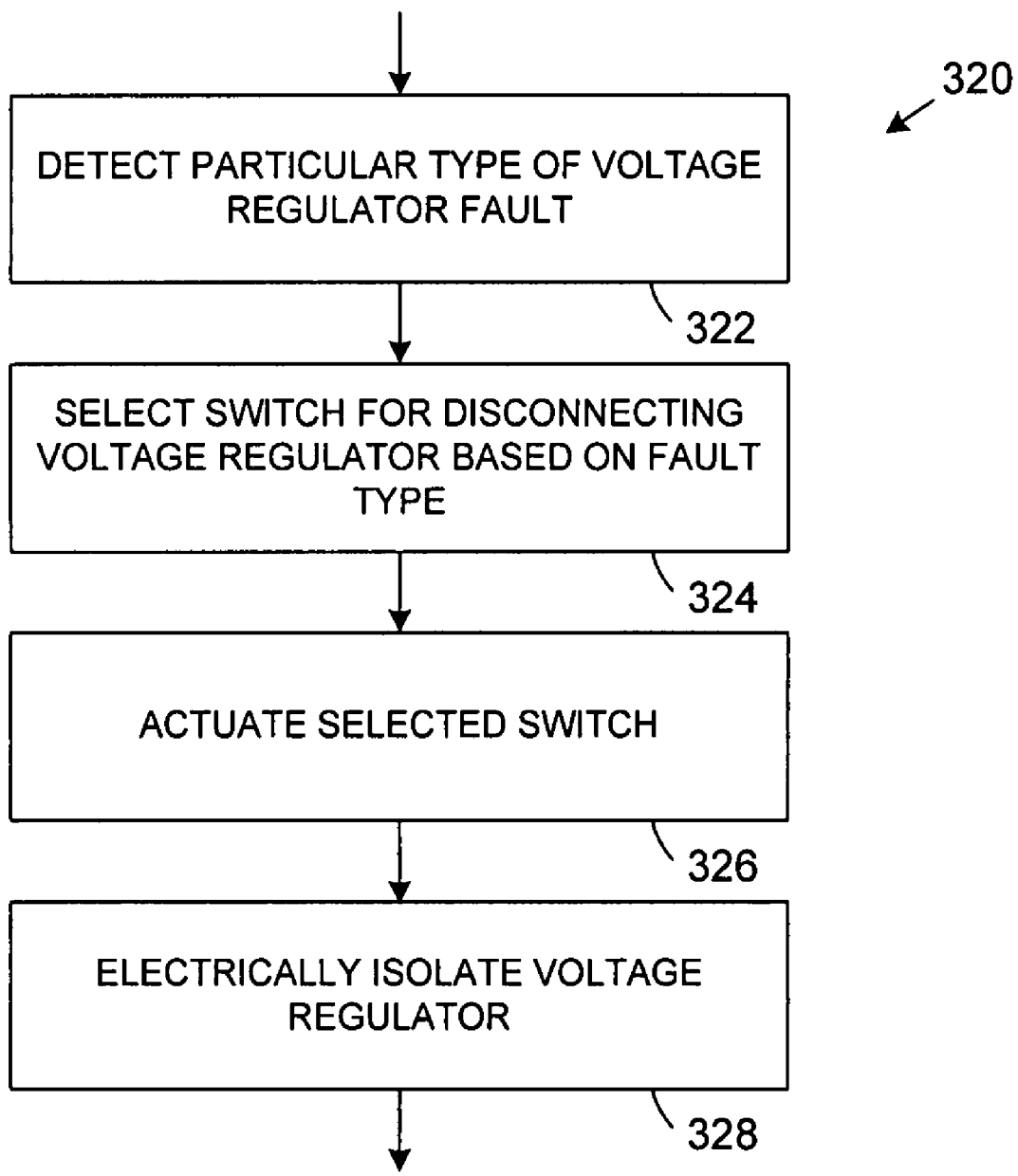

Referring to FIGS. 3A and 3B, flow charts illustrate one or more embodiments or aspects of a method for detecting failure or fault in a voltage regulator. FIG. 3A depicts a method 300 for voltage regulator failure detection comprising monitoring 302 voltage regulator signals at a controller node and a phase node and delaying 304 the signals at the controller node into alignment with the signals at the phase node. The signals at the phase node are converted 306 into two or more digital representations indicative of respective signal thresholds. Timing of the delayed signals is compared 308 with the digital representations, enabling voltage regulator failures or faults to be detected 310 based on the timing comparison. By detecting 310 the voltage regulator fault based on the timing comparison, the fault can be detected before detection is possible by sampling for voltage dip at the output voltage terminal of the voltage regulator.

An error signal can be latched 312 upon detection of the voltage regulator fault and the voltage regulator subject to the fault or failure can be electrically isolated 314.

In an illustrative embodiment, the voltage regulator signals can be monitored 302 at a controller node at an output terminal of a controller such as a direct current (DC)-DC converter or a pulse width modulator that couples to an input terminal of a driver circuit. The voltage regulator signals can also be monitored 302 at a phase node coupled to an output terminal of the driver circuit.

Multiple types of voltage regulator failures or faults can be detected 310 including a short-circuit, a resistive failure, and an open-circuit.

Referring to FIG. 3B, a method 320 for responding to detection of a fault in a voltage regulator. The method 320 comprises detecting 322 a type of voltage regulator fault and selecting 324 a switch for disconnecting a voltage regulator based on the detected fault type. By actuating 326 the switch, the voltage regulator is electrically isolated 328.

Time waveforms are analyzed to determine whether a failure has occurred and, if so, whether the fault is a short-circuit, resistive failure, or open-circuit fault. Analysis also determines whether the upper or lower FET of the driver circuit is subject to the failure. Accordingly, a large amount of information is available from the waveform analysis.

Referring to FIGS. 4A through 4F, a series of time waveforms illustrates operation of embodiments of the illustrative voltage regulator failure detection circuit, system, and operating method during normal operation. FIGS. 4A and 4B respectively show an example of the time waveform of a signal 400 at the pulse width modulator (PWM) node and the PWM node signal 402 after the imposed delay. FIG. 4C shows the voltage signal 404 at the phase node in combination with the high (phase_node_high) 406H and low (phase_node_low) 406L thresholds for level detection. FIGS. 4D and 4E illustrate the digital signals resulting from the level detection, respectively showing phase_node_low_h 408 and phase_node_high_h 410 digital signals. FIG. 4F shows a fault signal 412 which is generated by the analysis.

Voltage regulator fault analysis includes a comparison of the delayed PWM node signal 402 to the phase_node_low_h 408 and the phase_node_high_h 410 signals. In the illustrative embodiments, generally stated the comparison is made to determine whether the phase_node_low_h 408 and phase_node_high_h 410 signals are high when expected relative to the delayed PWM node signal 402. For example, as shown in FIG. 4D during correct operation phase_node_low_h 408 is high at a time relative to the time interval that the PWM delayed node signal 402 is high. A similar comparison is made as shown in FIG. 4E in correct operation in which the phase_node_high_h 410 is high relative to the PWM delayed node signal 402. Accordingly as shown in correct operation, phase_node_low_h 408 goes high a predictable time interval before the leading edge of the PWM delayed node signal 402 and the phase_node high_h 410 goes high a predictable time interval following the PWM delayed node leading edge. Similarly, phase_node_high_h 410 transitions low a predictable time interval before the trailing edge of the PWM delayed node signal 402 and phase_node_low_h 408 transitions low a predictable time interval following the trailing edge of the PWM delayed node signal 402.

The specific time intervals are predictable based on the particular selected phase_node_high and phase_node_low thresholds. In the illustrative example, the level detector functions based on the two set thresholds to define a time at which a signal for comparison transitions high and a time at which the comparison signal transitions low. The thresholds are selected to ensure that the phase signal transitions fully to a high voltage signal level and then transitions fully to a low voltage signal level. Analysis using multiple thresholds enables very fast and accurate detection.

Referring to FIGS. 5A through 5F, a series of time waveforms illustrates operation of embodiments of the illustrative voltage regulator failure detection circuit, system, and operating method in conditions of a resistive failure in an upper field effect transistor (FET) of driver circuit. FIGS. 5A and 5B respectively show an example of the time waveform of a signal 500 at the pulse width modulator (PWM) node and the PWM node signal 502 after the imposed delay. FIG. 5C shows the voltage signal 504 at the phase node in combination with the high (phase_node_high) 506H and low (phase_node_low) 506L thresholds for level detection. FIGS. 5D and 5E illustrate the digital signals resulting from the level detection, respectively showing phase_node_low_h 508 and phase_node_high_h 510 digital signals. FIG. 5F shows a fault signal 512 resulting from a resistive fault in the upper FET.

For the condition that the upper FET fails resistively, then the signal at the phase node 504 would probably pass the phase_node_high threshold 506H but would not proceed completely to the phase_node_low threshold 506L.

In operation of the illustrative circuit, in a resistive fault the upper FET functions as a resistor and the bottom FET is fixed to ground, then the phase node signal 504 does not fully transition to the low state and the output voltage is not driven sufficiently low. The illustrative technique enables detection of the fault because the FETs function as a voltage divider since the lower FET has an inherent resistance.

Creation and analysis of phase_node_high_h 510 and phase_node_low_h 508 enables detection of a resistive type failure in addition to detection of a pure short-circuit. For the resistive fault, the phase node signal 504 either does not fully reach the high voltage level or the low level depending on which FET is subject to the resistive failure. For example, as shown in FIG. 5C for a resistive failure of the upper FET, the phase node signal 504 transitions to a suitable high level thereby triggering the leading edges of phase_node_low_h 508 as shown in FIG. 5D and the phase_node_high_h 510 depicted in FIG. 5E. For the illustrative resistive fault, the phase node signal 504 is pulled low sufficiently to transition to the low state in phase_node_low_h 508 but cannot pull the phase node signal 504 low an amount sufficient to trigger the transition to low of the phase_node_high_h 510. Thus, the fault signal 512 is activated when the PWM delayed node signal 502 transitions low.

The technique for detecting resistive failures ensures that the phase node signal fully reaches the high level and the low level. Accordingly, the phase node signal is divided into both a high signal indication and a low signal indication. In contrast, a pure short-circuit can be detected more easily, for example using a single detection level for analysis.

Referring to FIGS. 6A through 6F, a series of time waveforms illustrates operation of embodiments of the illustrative voltage regulator failure detection circuit, system, and operating method in conditions of a short-circuit failure in an upper field effect transistor (FET) of driver circuit. FIGS. 6A and 6B respectively show an example of the time waveform of a signal 600 at the pulse width modulator (PWM) node and the PWM node signal 602 after the imposed delay. FIG. 6C shows the voltage signal 604 at the phase node in combination with the high (phase_node_high) 606H and low (phase_node_low) 606L thresholds for level detection. FIGS. 6D and 6E illustrate the digital signals resulting from the level detection, respectively showing phase_node_low_h 608 and phase_node_high_h 610 digital signals. FIG. 6F shows a fault signal 612 resulting from a short-circuit fault in the upper FET.

Referring to the waveforms in FIGS. 6A through 6F, in a condition of an upper FET short-circuit, as the PWM node signal 602 goes high the signal 604 at the PWM delayed node follows with delay. As the PWM delayed node signal 602 goes high, the phase_node_low_h signal 608 and the phase_node_high_h signal 610 behave correctly, but when the PWM delayed node signal 602 begins dropping the phase_node_high_h signal 610 does not change when expected and a fault can be detected. Because failure of the phase_node_high_h 410 to change is the first possible measurable indication of failure, the illustrative technique is the fastest that the fault can possibly be detected.

The illustrative circuits, systems, and techniques are configured to detect failures or faults as quickly as theoretically possible. More typical techniques involving monitoring of voltage at the output node for detection of a voltage dip do not enable the much quicker detection described herein. Accordingly, the illustrative circuits, systems, and techniques enable much faster detection and enable detection and discrimination of many more types of faults, performance characteristics that are highly useful in systems that operate with very low currents and relatively high current. Such systems can typically operate suitably with only a very small voltage dip in a failure condition. The illustrative structures and techniques enable the fastest possible detection, usually even before the output voltage changes, so that corrective action can be invoked before damage can occur.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

The illustrative block diagrams and flow charts depict process steps or blocks that may represent modules, segments, or portions of code that include one or more executable instructions for implementing specific logical functions or steps in the process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. A method for voltage regulator failure detection comprising:
   monitoring voltage regulator signals at a controller node and a phase node;
   delaying the signals at the controller node into alignment with the signals at the phase node;
   converting the signals at the phase node into at least two digital representations indicative of respective at least two signal thresholds;
   comparing timing of the delayed signals with the at least two digital representations; and
   detecting occurrence of a voltage regulator fault based on the timing comparison.

2. The method according to claim 1 further comprising:
   latching an error signal for a detected voltage regulator fault occurrence; and
   electrically isolating a voltage regulator subject to the fault.

3. The method according to claim 1 further comprising:
   monitoring at the controller node a signal that is input to a driver circuit; and
   monitoring at the phase node a signal that is output from the driver circuit.

4. The method according to claim 1 further comprising:
   detecting occurrence of a voltage regulator fault including a short-circuit, a resistive failure, and an open-circuit.

5. The method according to claim 1 further comprising:
   detecting the voltage regulator fault based on the timing comparison before the fault can be detected at an output voltage terminal of the voltage regulator.

6. The method according to claim 1 further comprising:
   monitoring voltage regulator signals for a plurality of phases; and
   detecting occurrence of a voltage regulator fault per-phase for the plurality of phases.

7. The method according to claim 1 further comprising:
   detecting a type of voltage regulator fault;
   selecting a switch for disconnecting a voltage regulator based on the detected fault type; and
   electrically isolating the voltage regulator at the selected switch.

8. A control logic configured for detecting voltage regulator failure in a power supply comprising:

first and second lines configured for respective connection to a controller node and a phase node of a voltage regulator;

a delay element coupled to the first line configured to delay signals at the controller node into alignment with signals at the phase node;

a level detector coupled to the second line configured to convert the signals at the phase node into at least two digital representations indicative of respective at least two signal thresholds; and a logic that compares timing of the delayed signals with the at least two digital representations and detects occurrence of a voltage regulator fault based on the timing comparison.

9. The control logic according to claim 8 further comprising:

a latch coupled to the logic configured for latching an error signal for a detected voltage regulator fault; and at least one switch coupled to the latch configured to electrically isolate a voltage regulator subject to the fault.

10. The control logic according to claim 8 further comprising:

the first line configured for connection to an output node of a pulse width modulator; and the second line configured for connection to an output node of a driver circuit.

11. The control logic according to claim 8 further comprising:

a logic that compares timing of the delayed signals with the at least two digital representations and detects occurrence of a voltage regulator fault including a short-circuit, a resistive failure, and an open-circuit based on the timing comparison.

12. The control logic according to claim 8 further comprising:

a logic configured to detect a voltage regulator fault before the fault can be detected at an output voltage terminal of the voltage regulator.

13. The control logic according to claim 8 further comprising:

the logic configured for monitoring voltage regulator signals for a plurality of phases and detecting voltage regulator fault per-phase for the plurality of phases.

14. The control logic according to claim 8 further comprising:

at least one control line coupled to the logic and respectively coupled to at least one switch; and the logic configured for detecting a type of voltage regulator fault, selecting a switch from the at least one switch adapted for disconnecting a voltage regulator based on the detected fault type, and electrically isolating the voltage regulator at the selected switch.

15. A power supply comprising:

at least one voltage regulator comprising:

a direct current (DC)-DC converter;

a driver circuit coupled to the DC-DC converter at a controller node and configured to drive a controller voltage at a phase node; and a control logic communicatively coupled to the controller node and the phase node configured for detecting voltage regulator failure in the power supply comprising:

a delay element coupled to the controller node configured to delay signals at the controller node into alignment with signals at the phase node;

a level detector coupled to the phase node configured to convert the signals at the phase node into at least two digital representations indicative of respective at least two signal thresholds; and a logic that compares timing of the delayed signals with the at least two digital representations and detects occurrence of a voltage regulator fault based on the timing comparison.

16. The power supply according to claim 15 further comprising:

the control logic further comprising:

a latch coupled to the logic configured for latching an error signal for a detected voltage regulator fault; and at least one switch coupled to the latch configured to electrically isolate a voltage regulator subject to the fault.

17. The power supply according to claim 15 further comprising:

the control logic further comprising:

a logic that compares timing of the delayed signals with the at least two digital representations and detects occurrence of a voltage regulator fault including a short-circuit, a resistive failure, and an open-circuit based on the timing comparison.

18. The power supply according to claim 15 further comprising:

the control logic further comprising:

a logic configured to detect a voltage regulator fault before the fault can be detected at an output voltage terminal of the voltage regulator.

19. The power supply according to claim 15 further comprising:

the control logic further comprising:

the logic configured for monitoring voltage regulator signals for a plurality of phases and detecting voltage regulator fault per-phase for the plurality of phases.

20. The power supply according to claim 15 further comprising:

the at least one voltage regulator further comprising:

at least one switch; and the control logic further comprising a logic configured for detecting a type of voltage regulator fault, selecting a switch from the at least one switch adapted for disconnecting a voltage regulator based on the detected fault type, and electrically isolating the voltage regulator at the selected switch.

* * * * *